United States Patent
Zhu (10) Patent No.: US 12,464,807 B2
(45) Date of Patent: Nov. 4, 2025

(54) SEMICONDUCTOR APPARATUS INCLUDING CAPACITOR AND METHOD OF MANUFACTURING THE SAME, AND ELECTRONIC DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 604 days.

(21) Appl. No.: 17/908,596

(22) PCT Filed: Feb. 24, 2021

(86) PCT No.: PCT/CN2021/077627
§ 371 (c)(1),
(2) Date: Sep. 1, 2022

(87) PCT Pub. No.: WO2021/175136
PCT Pub. Date: Sep. 10, 2021

(65) Prior Publication Data
US 2023/0092643 A1    Mar. 23, 2023

(30) Foreign Application Priority Data
Mar. 3, 2020 (CN) .................. 202010141125.1

(51) Int. Cl.
*H10D 84/80* (2025.01)
*H10D 1/00* (2025.01)
(Continued)

(52) U.S. Cl.
CPC .......... *H10D 84/811* (2025.01); *H10D 1/047* (2025.01); *H10D 1/66* (2025.01); *H10D 30/025* (2025.01); *H10D 30/63* (2025.01)

(58) Field of Classification Search
CPC ......... H10D 30/6728; H10D 1/60-716; H10D 84/811-813; H10D 84/016;
(Continued)

(56) References Cited

U.S. PATENT DOCUMENTS

| 5,627,390 | A | 5/1997 | Maeda et al. |
| 6,383,860 | B2 * | 5/2002 | Maeda .................. H10B 12/34 |
| | | | 438/249 |

(Continued)

FOREIGN PATENT DOCUMENTS

| CN | 108110059 A | * 6/2018 | ......... H01L 21/3065 |
| CN | 111326509 A | 6/2020 | |

OTHER PUBLICATIONS

International Search Report and Written Opinion for Chinese Application No. PCT/CN2021/077627, dated May 12, 2021, 11 pages including English translation.

(Continued)

*Primary Examiner* — Christine S. Kim
*Assistant Examiner* — Cole Leon Lindsey
(74) *Attorney, Agent, or Firm* — Christopher R. Christenson; Kelly, Holt & Christenson. P.L.L.C.

(57) ABSTRACT

A semiconductor apparatus including a capacitor and a method of manufacturing the same, and an electronic device including the semiconductor apparatus are provided. According to embodiments, the semiconductor apparatus may include: a vertical semiconductor device including an active region extending vertically on a substrate; and a capacitor including a first capacitor electrode, a capacitor dielectric layer and a second capacitor electrode sequentially
(Continued)

stacked. The first capacitor electrode extends vertically on the substrate and includes a conductive material, and the conductive material includes at least one semiconductor element contained in the active region of the vertical semiconductor device.

35 Claims, 8 Drawing Sheets

(51) Int. Cl.
*H10D 1/66* (2025.01)
*H10D 30/01* (2025.01)
*H10D 30/63* (2025.01)

(58) Field of Classification Search
CPC .... H10D 84/642; H10D 84/643; H10D 30/63; H10D 84/0195; H10D 30/0291–0297; H10D 30/66–669; H10D 12/032–038; H10D 12/441–491; H10B 63/34; H10K 10/491

See application file for complete search history.

(56) References Cited

U.S. PATENT DOCUMENTS

| | | | |
|---|---|---|---|
| 9,991,267 B1* | 6/2018 | Anderson | H10D 1/692 |
| 2017/0294536 A1* | 10/2017 | Anderson | H10D 1/692 |
| 2018/0204833 A1* | 7/2018 | Cheng | H10D 30/63 |

OTHER PUBLICATIONS

First Office Action for Chinese Application No. 202010141125.1, dated Jul. 1, 2022, 15 pages including English translation.

* cited by examiner

SEMICONDUCTOR APPARATUS INCLUDING CAPACITOR AND METHOD OF MANUFACTURING THE SAME, AND ELECTRONIC DEVICE

CROSS REFERENCE TO RELATED APPLICATION(S)

This application is a Section 371 National Stage Application of International Application No. PCT/CN2021/077627, filed on Feb. 24, 2021, which claims priority to Chinese Patent Application No. 202010141125.1 entitled "SEMICONDUCTOR APPARATUS INCLUDING CAPACITOR AND METHOD OF MANUFACTURING THE SAME, AND ELECTRONIC DEVICE", filed on Mar. 3, 2020, the content of which are incorporated herein by reference in their entirety.

TECHNICAL FIELD

The present disclosure relates to a field of semiconductors, and in particular to a semiconductor apparatus integrated with a capacitor and a vertical semiconductor device, a method of manufacturing the semiconductor apparatus, and an electronic device including the semiconductor apparatus.

BACKGROUND

In a horizontal device such as a metal oxide semiconductor field effect transistor (MOSFET), a source electrode, a gate electrode and a drain electrode are arranged in a direction substantially parallel to a substrate surface. Due to the arrangement, an area occupied by the horizontal device may not easily be further reduced or a manufacturing cost may not easily be further reduced. In contrast, in a vertical device, a source electrode, a gate electrode and a drain electrode are arranged in a direction substantially perpendicular to the substrate surface. Therefore, different from the horizontal device, the vertical device may be downsized more easily or the manufacturing cost thereof may be reduced more easily. However, for the vertical device, it is difficult to control a gate length, especially for a single crystal channel material, because the gate length depends on an etch timing in an existing process, which is difficult to be controlled. Moreover, if a polycrystalline channel material is used, a channel resistance may be greatly increased relative to the single crystal material, which causes it difficult to stack multiple vertical elements as this may result in an excessively high resistance.

Furthermore, a capacitor, such as a decoupling capacitor, may be required in some integrated circuits (ICs). However, how to manufacture a capacitor with a small occupied area relatively easily remains a challenge.

SUMMARY

In view of this, an objective of the present disclosure is, at least in part, to provide a semiconductor apparatus integrated with a capacitor and a vertical semiconductor device, a method of manufacturing the semiconductor apparatus, and an electronic device including the semiconductor apparatus.

According to an aspect of the present disclosure, a semiconductor apparatus is provided, including: a vertical semiconductor device including an active region extending vertically on a substrate; and a capacitor including a first capacitor electrode, a capacitor dielectric, and a second capacitor electrode sequentially stacked. The first capacitor electrode extends vertically on the substrate and includes a conductive material, and the conductive material contains at least one semiconductor element contained in the active region of the vertical semiconductor device.

According to another aspect of the present disclosure, a method of manufacturing a semiconductor apparatus is provided, including: forming a stack of a first semiconductor layer, a second semiconductor layer, and a third semiconductor layer on a substrate; patterning the stack into a first vertical structure and a second vertical structure; laterally recessing the second semiconductor layer in the first vertical structure relative to the first semiconductor layer and the third semiconductor layer in the first vertical structure, and forming a sacrificial gate in the formed recess; driving a doping impurity inward from a surface of the first vertical structure and a surface of the second vertical structure; forming an isolation layer on the substrate; removing the sacrificial gate; forming a gate stack, on the isolation layer, around at least a portion of a periphery of the second semiconductor layer in the first vertical structure; and forming a capacitor dielectric layer and another capacitor electrode on the surface of the second vertical structure.

According to another aspect of the present disclosure, an electronic device is provided, including the above-mentioned semiconductor apparatus.

BRIEF DESCRIPTION OF THE DRAWINGS

The above and other objectives, features, and advantages of the present disclosure will be clearer through the following description of embodiments of the present disclosure with reference to the accompanying drawings, wherein.

Throughout the accompanying drawings, the same or similar reference signs represent the same or similar components.

DETAILED DESCRIPTION OF EMBODIMENTS

Embodiments of the present disclosure will be described below with reference to the accompanying drawings. It should be understood, however, that the descriptions are merely exemplary, and are not intended to limit the scope of the present disclosure. In addition, in the following description, descriptions of well-known structures and techniques are omitted to avoid unnecessarily obscuring the concepts of the present disclosure.

Various schematic structural diagrams according to embodiments of the present disclosure are shown in the accompanying drawings. The figures are not drawn to scale. Some details are enlarged and some details may be omitted for clarity of presentation. The shapes of the various regions, layers as well as the relative size and positional relationship thereof shown in the figures are only exemplary. In practice, there may be deviations due to manufacturing tolerances or technical limitations, and those skilled in the art may additionally design regions/layers with different shapes, sizes, and relative positions according to actual needs.

In the context of the present disclosure, when a layer/element is referred to as being located "on" another layer/element, the layer/element may be directly on the another layer/element, or there may be an intermediate layer/element therebetween. In addition, if a layer/element is located "on"

another layer/element in one orientation, the layer/element may be located "under" the another layer/element when the orientation is reversed.

According to embodiments of the present disclosure, a semiconductor apparatus based on a vertical semiconductor device is provided. The vertical semiconductor device may include an active region extending vertically (e.g, in a direction substantially perpendicular to a substrate surface) on a substrate. The active region may include a first source/drain layer, a channel layer, and a second source/drain layer sequentially stacked on the substrate. The first source/drain layer and the second source/drain layer may have a source/drain region of the device formed therein, and a channel region of the device may be formed in the channel layer. According to embodiments of the present disclosure, the semiconductor device may be an existing field effect transistor (FET). In a case of the FET, the first source/drain layer and the second source/drain layer (in other words, source and drain regions located on both sides of the channel layer) may have doping of the same conductivity type (e.g., n-type or p-type). A conductive channel may be formed through the channel region between the source region and the drain region located at both ends of the channel region. Alternatively, the semiconductor device may be a tunneling FET. In a case of the tunneling FET, the first source/drain layer and the second source/drain layer (in other words, the source and drain regions located on both sides of the channel layer) may have doping of different conductivity types (e.g., n-type and p-type, respectively). In this case, charged particles such as electrons may tunnel from the source region through the channel region and into the drain region, thereby forming a conduction path between the source region and the drain region. Although conduction mechanisms in the existing FET and the tunneling FET are not the same, they both exhibit electrical properties in which a conduction between the source region and the drain region may be controlled through a gate. Therefore, the terms "source/drain layer (source/drain region)" and "channel layer (channel region)" are collectively described for the existing FET and tunneling FET, although there is no "channel" in the usual sense in the tunneling FET.

A gate stack may be formed around at least a portion of a periphery of the channel layer. Thus, a gate length may be determined by a thickness of the channel layer, rather than determined according to the etching timing as in an existing technique. The channel layer may be formed by, for example, an epitaxial growth, so that the thickness of the channel layer may be well controlled. Therefore, the gate length may be well controlled. A periphery of the channel layer may be recessed relative to peripheries of the first and second source/drain layers so as to define a space for accommodating the gate stack in a self-aligned manner. In this way, the formed gate stack may be embedded in a recess of the channel layer relative to the first and second source/drain layers, which may reduce or even avoid an overlap with the source and drain regions, and help reduce a parasitic capacitance between the gate and the source and drain regions.

The channel layer may be composed of a single crystal semiconductor material to improve a device performance. The first and second source/drain layers may also be composed of a single crystal semiconductor material. In this case, the single crystal semiconductor material of the channel layer and the single crystal semiconductor material of the source/drain layers may be eutectic.

According to embodiments of the present disclosure, the doping for the source and drain regions may partially enter ends of the channel layer close to the first source/drain layer and the second source/drain layer. Thus, a doping distribution is formed at the ends of the channel layer close to the first source/drain layer and the second source/drain layer, which may help reduce a resistance between the source/drain region and the channel region when the device is turned on and may thus improve a device performance.

According to embodiments of the present disclosure, the channel layer may include a semiconductor material having an etching selectivity relative to the first and second source/drain layers, which is conducive to perform a processing, such as a selective etching, on the channel layer, so that the channel layer may be recessed relative to the first and second source/drain layers. Furthermore, the first source/drain layer and the second source/drain layer may include the same semiconductor material.

For example, the first source/drain layer may be a semiconductor substrate itself. In this case, the channel layer may be a semiconductor layer epitaxially grown on the substrate, and the second source/drain layer may be a semiconductor layer epitaxially grown on the channel layer. Alternatively, the first source/drain layer may be a semiconductor layer epitaxially grown on the substrate. In this case, the channel layer may be a semiconductor layer epitaxially grown on the first source/drain layer, and the second source/drain layer may be a semiconductor layer epitaxially grown on the channel layer.

A capacitor, such as a decoupling capacitor connected to one of the source and drain regions of the semiconductor device, may also be integrated in the semiconductor apparatus according to embodiments of the present disclosure. One plate of the capacitor may be formed by a dummy active region defined together with the active region of the vertical semiconductor device. Thus, the capacitor electrode may has a similar or even substantially the same vertical structure on the substrate as the active region, and may include a conductive material in which at least one semiconductor element contained in the active region of the semiconductor device is contained, such as a silicide formed by a silicification reaction of a semiconductor element and a metal element. In a vertical direction, a distribution for the semiconductor element in the capacitor electrode may be substantially the same as a distribution for the semiconductor element in the active region of the vertical semiconductor device.

In order to provide an etching selectivity, in the active region, the channel layer may differ in an element type and/or element content relative to the first and second source/drain layers. Accordingly, in the vertical direction, the semiconductor element contained in the capacitor electrode may have a change in the element type and/or element content. The change in the element type and/or element content of the semiconductor element contained in the capacitor electrode may be substantially the same as a change in the element type and/or element content of the same semiconductor element contained in at least a portion (e.g., Si element distribution along a central axis of the channel) of the vertical semiconductor device. The change may be a sudden change at a certain height (e.g., at boundaries between the channel layer and the first and second source/drain layers) relative to the substrate.

According to embodiments of the present disclosure, a contact plug may be formed by a dummy active region defined together with the active region of the vertical device. Similar to the capacitor electrode, the contact plug may has a vertical structure on the substrate that is similar or even substantially the same as the active region, and may include a conductive material in which at least one semiconductor element contained in the active region of the semiconductor device is contained, such as a silicide formed by a silicification reaction of a semiconductor element and a metal element. In a vertical direction, a distribution for the semiconductor element in the contact plug may be substantially the same as a distribution for the semiconductor element in the active region of the semiconductor device or the capacitor electrode.

According to embodiments of the present disclosure, a dielectric layer and another plate of the capacitor may be formed by using a gate dielectric layer and a gate conductor layer of the semiconductor device.

The semiconductor device may be manufactured as follows, for example. Specifically, the first source/drain layer may be provided on the substrate. As described above, the first source/drain layer may be provided by the substrate itself or by an epitaxial growth on the substrate. Next, the channel layer may be epitaxially grown on the first source/drain layer, and the second source/drain layer may be epitaxially grown on the channel layer. During the epitaxial growth, a thickness of the grown channel layer may be controlled. Due to a separate epitaxial growth, there may be a clear crystal interface between the layers.

The active region and the dummy active region may be defined in the stacked first source/drain layer, channel layer and second source/drain layer. For example, the active region and the dummy active region may be selectively etched sequentially into desired shapes. Generally, the active region and the dummy active region may be columnar (e.g., cylindrical) structures.

For the active region, the gate stack may be formed around the periphery of the channel layer. According to embodiments of the present disclosure, the periphery of the channel layer may be recessed relative to the peripheries of the first and second source/drain layers so as to define a space for accommodating the gate stack. In this case, the gate stack may be embedded in the recess. The gate stack thus formed may be self-aligned with the channel layer, or substantially coplanar with the channel layer. Coplanarity between layers may refer to at least one selected from: upper surfaces of the layers being coplanar, lower surfaces of the layers being coplanar, or intermediate surfaces of the layers being coplanar.

The first and second source/drain layers may have a source/drain region formed therein. For example, this may be achieved by doping the first and second source/drain layers. For example, an ion implantation, a plasma doping, or an in-situ doping during a growth of the first and second source/drain layers may be performed. According to an advantageous embodiment, a sacrificial gate may be formed in the recess formed at the periphery of the channel layer relative to the peripheries of the first and second source/drain layers. Then, a dopant source layer may be formed on surfaces of the first and second source/drain layers, and a dopant in the dopant source layer may be driven into the active region through the first and second source/drain layers by, for example, annealing. The sacrificial gate may prevent the dopant in the dopant source layer from directly entering the channel layer. However, a portion of the dopant may enter ends of the channel layer close to the first source/drain layer and the second source/drain layer through the first and second source/drain layers.

The doping of the source and drain regions may also be performed on the dummy active region, thereby enhancing a conductivity of the dummy active region. A silicification treatment may also be performed on the active region and/or the dummy active region so as to reduce a contact resistance. Therefore, the dummy active region may be converted into a conductive plug, and thus may be used as a capacitor electrode and/or contact plug.

The present disclosure may be presented in various forms, some examples of which will be described below. In the following description, a selection of various materials is involved. In the selection of materials, in addition to a function of the material (for example, a semiconductor material may be used for forming an active region, a dielectric material may be used for forming an electrical isolation), an etching selectivity is also considered. In the following description, a desired etching selectivity may or may not be indicated. It should be clear to those skilled in the art that when etching a material layer is mentioned below, if it is not mentioned or shown that other layers are also etched, then the etching may be selective, and the material layer may have an etching selectivity relative to other layers exposed to the same etching formula.

FIG. 1 to FIG. 13 schematically show some stages in a process of manufacturing a semiconductor device according to embodiments of the present disclosure.

Figure 1:
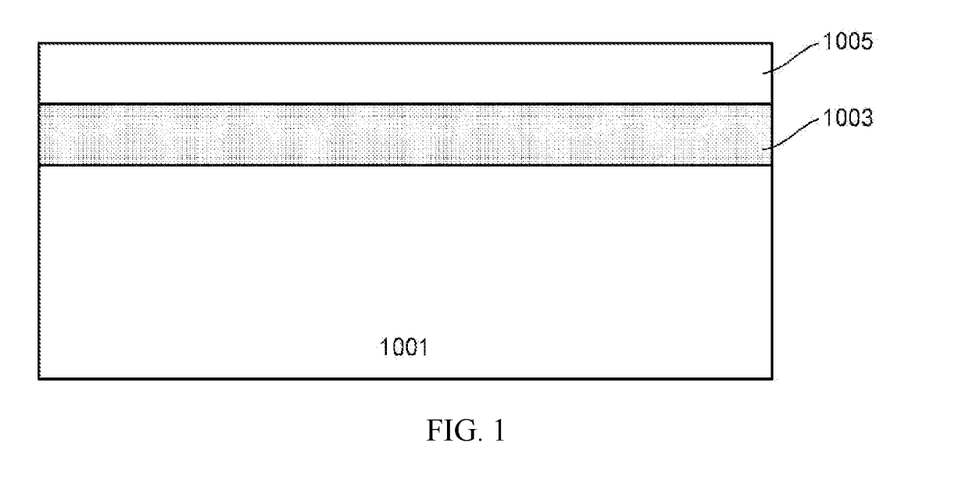
FIG. 1 to FIG. 13 schematically show some stages in a process of manufacturing a semiconductor device according to embodiments of the present disclosure.

As shown in FIG. 1, a substrate 1001 is provided. The substrate 1001 may be a substrate of various forms including, but not limited to, a bulk semiconductor material substrate such as a bulk Si substrate, a semiconductor-on-insulator (SOI) substrate, a compound semiconductor substrate such as a SiGe substrate, and the like. In the following description, for the convenience of description, the bulk Si substrate is described as an example.

A well region may be formed in the substrate 1001. For example, if a p-type device is to be formed, an n-type well region may be formed; and if an n-type device is to be formed, a p-type well region may be formed. The well region may be formed by, for example, implanting a dopant of a corresponding conductivity type (p-type or n-type) into the substrate 1001. There are many ways in the art to provide the well region, which will not be repeated here.

A channel layer 1003 and another semiconductor layer 1005 may be sequentially formed on the substrate 1001 by, for example, an epitaxial growth. In these semiconductor layers, adjacent layers may have an etching selectivity relative to each other. For example, the channel layer 1003 may include a semiconductor material different from that of the substrate 1001 and the semiconductor layer 1005, such as SiGe (an atomic percentage of Ge may be in a range of about 10% to 40%), and have a thickness in a range of about 10 nm to 100 nm; the semiconductor layer 1005 may include the same semiconductor material as that of the substrate 1001 such as Si, and have a thickness in a range of about 20 nm to 50 nm. The present disclosure is not limited thereto. For example, the channel layer 1003 may include the same constituent composition as that of the substrate 1001 or the semiconductor layer 1005. However, for semiconductor materials (e.g., which are all SiGe, but have different atomic percentages of Ge) with different composition contents, as long as the channel layer 1003 has an etching selectivity relative to the substrate 1001 located below the channel layer 1003 and the semiconductor layer 1005 located above the channel layer 1003.

Next, an active region of the device may be defined. According to embodiments of the present disclosure, a capacitor electrode and/or contact portion may be formed by a process of improving a conductivity (e.g., doping an impurity, performing a silicification treatment) in a partial region of the semiconductor layer used to define the active region. Thus, the capacitor electrode and/or contact portion may be defined together with the active region, which may be referred to herein as a dummy active region, for example, which may be implemented as follows.

Figure 2:
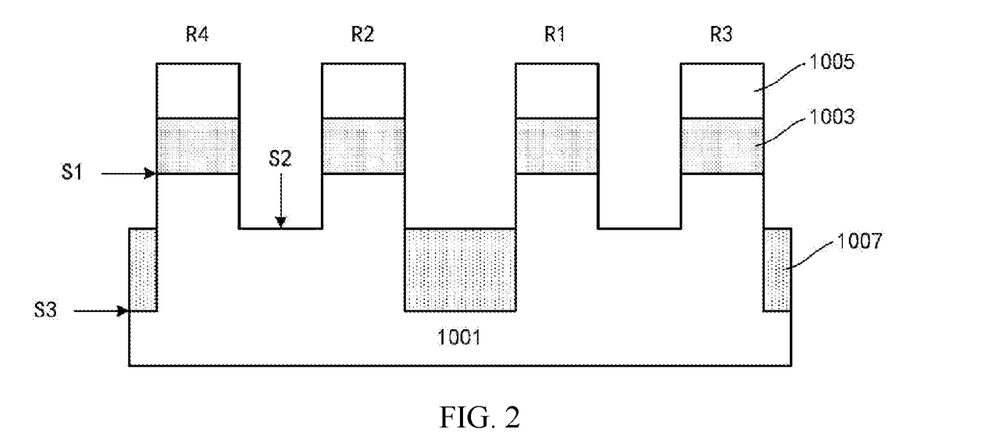

Specifically, as shown in FIG. 2, a photoresist may be formed on a stack of the substrate 1001, the channel layer 1003 and the semiconductor layer 1005 shown in FIG. 1. The photoresist may be patterned into a desired shape by photolithography (exposure and development), and the semiconductor layer 1005, the channel layer 1003 and the substrate 1001 are selectively etched sequentially, such as Reactive Ion Etching (RIE), with the patterned photoresist as a mask. The etching proceeds into the substrate 1001, but not to a bottom surface of the substrate 1001. FIG. 2 schematically shows a top surface S1 of an unetched portion of the substrate 1001 and an upper surface S2 of an etched portion of the substrate 1001. Then, the etched semiconductor layer 1005, channel layer 1003 and upper portion (a portion higher than the surface S2) of the substrate 1001 form a columnar structure. The RIE may be performed, for example, in a direction substantially perpendicular to the substrate surface, so that the formed columnar structure is also substantially perpendicular to the substrate surface. After that, the photoresist may be removed.

Four columnar structures R1 to R4 formed after the etching are shown. One (R1) of the four columnar structures is used to define the active region of the device, one (R2) of the four columnar structures is used to define the capacitor electrode, and the other two (R3, R4) of the four columnar structures are used to define a contact plug to the device and a contact plug to the capacitor electrode, respectively, which will be further described in detail below. Columnar structures of different shapes may be patterned according to a type of a device to be formed. For example, in order to form a nanowire device, a cylindrical structure with a circular cross section may be formed; and in order to form a nanosheet device, a hexagonal column structure with a rectangular or square cross section may be formed. The columnar structures may have a size (e.g., a diameter or a side length) in a range of about 15 nm to 200 nm. The columnar structures used to define the device, the capacitor electrode, the contact plugs may each differ in shape, size, and the like.

In addition, an isolation portion may be formed according to a layout design. In this example, the active region and a corresponding contact plug may be electrically connected to each other, and an isolation portion may be formed around them (R1, R3). In addition, the capacitor electrode and a corresponding contact plug may be electrically connected to each other, and an isolation portion may be formed around them (R2, R4). For example, the substrate 1001 may be further selectively etched, such as RIE, from the surface S2 around both columnar structures R1 and R3 and around both columnar structures R2 and R4, so as to form a trench (FIG. 2 schematically shows a bottom surface S3 of the trench). A dielectric such as an oxide (e.g., silicon oxide) is filled in the trench so as to form an isolation portion 1007 such as a shallow trench isolation (STI). A top surface of the isolation portion 1007 may be close to, e.g., slightly lower than the surface S2. The isolation portion 1007 may not be formed between the columnar structures R1 and R3 and between the columnar structures R2 and R4, because components defined by the columnar structures as described above may be electrically connected later.

Figure 3:
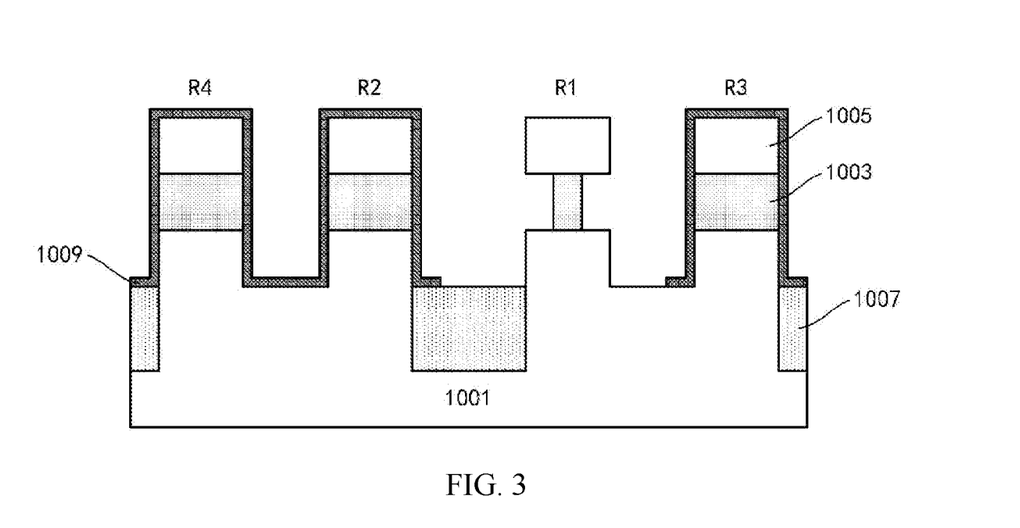

In order to form a self-aligned gate stack, a space aligned with the channel layer 1003 and accommodating (at least a portion of) the gate stack may be further defined. The operation may be performed only for the columnar structure R1 for defining the active region of the device. For example, as shown in FIG. 3, a shielding layer 1009 may be formed to shield the remaining columnar structures R2 to R4. The shielding layer 1009 may be formed by depositing, for example, a nitride (e.g., silicon nitride) on the structure shown in FIG. 2, and is patterned by photolithography to expose a region where the columnar structure R1 is located.

For the columnar structure R1, a periphery of the channel layer 1003 may be recessed (in this example, in a lateral direction substantially parallel to the substrate surface) relative to a periphery of the substrate 1001 and a periphery of the semiconductor layer 1005. For example, this may be achieved by further selectively etching the channel layer 1003 relative to the substrate 1001 and the semiconductor layer 1005. In order to better control an etching depth, an atomic layer etching (ALE) may be used. Alternatively, a digital etching may also be used. For example, surfaces of the substrate 1001, the channel layer 1003 and the semiconductor layer 1005 are oxidized by, for example, heat treatment, and then respective surface oxide layers thereof are removed. In a case that the channel layer 1003 is SiGe and the substrate 1001 and the semiconductor layer 1005 are Si, an oxidation rate of SiGe may be greater than that of Si, and an oxide on SiGe may be removed more easily. The oxidation-removal of oxide steps may be repeated to achieve a desired recess. After that, the shielding layer 1009 may be removed.

The active region (the current columnar structure R1) of the semiconductor device is defined. In the active region, the upper portion of the substrate 1001 may be substantially aligned with the periphery of the semiconductor layer 1005, while the periphery of the channel layer 1003 may be relatively recessed. The recess defines a location of the gate stack (at least an end thereof). As described above, an upper surface of the recess and a lower surface of the recess are respectively defined by an interface between the channel layer 1003 and the semiconductor layer 1005 and an interface between the channel layer 1003 and the substrate 1001, and are thus self-aligned to and substantially coplanar with the channel layer 1003.

Figure 4:
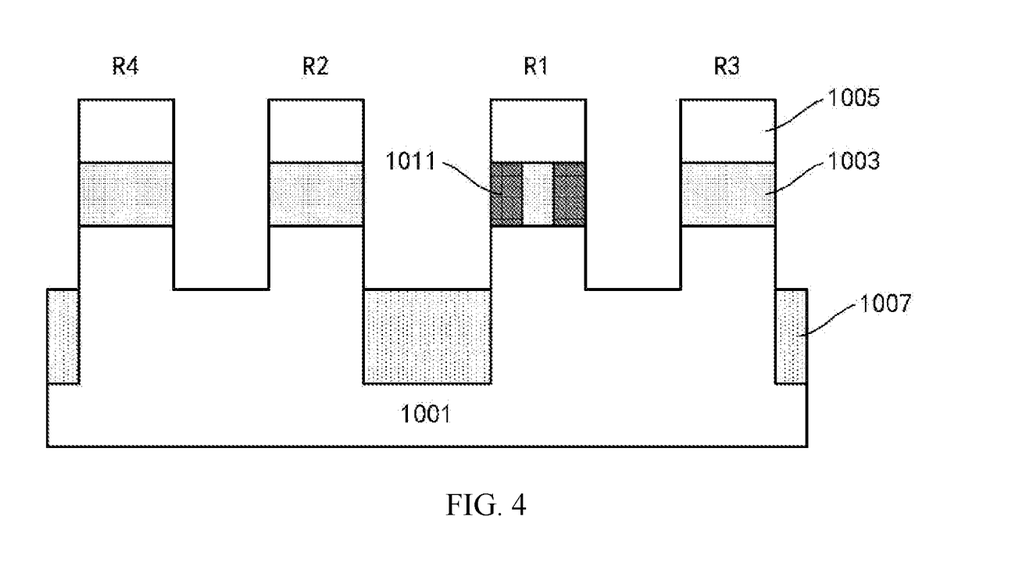

In order to prevent a subsequent processing from affecting the channel layer 1003 or leaving unnecessary materials in the above-mentioned recess to affect a formation of a subsequent gate stack, a material layer may be filled in the recess to occupy a space of the gate stack (thus, the material layer may be referred to as a "sacrificial gate"). For example, nitride may be deposited on the structure shown in FIG. 3 and then the deposited nitride may be etched back, such as RIE. The RIE may be performed in a direction substantially perpendicular to the substrate surface, and the nitride may be left only in the recess, so that a sacrificial gate 1011 is formed, as shown in FIG. 4. In this case, the sacrificial gate 1011 may substantially fill the above-mentioned recess.

Next, for the columnar structure R1, source and drain regions (or drain and source regions) may be formed in the substrate 1001 and the semiconductor layer 1005, respectively, which may be formed by doping the substrate 1001 and the semiconductor layer 1005, for example, which may be implemented as follows.

Figure 5:
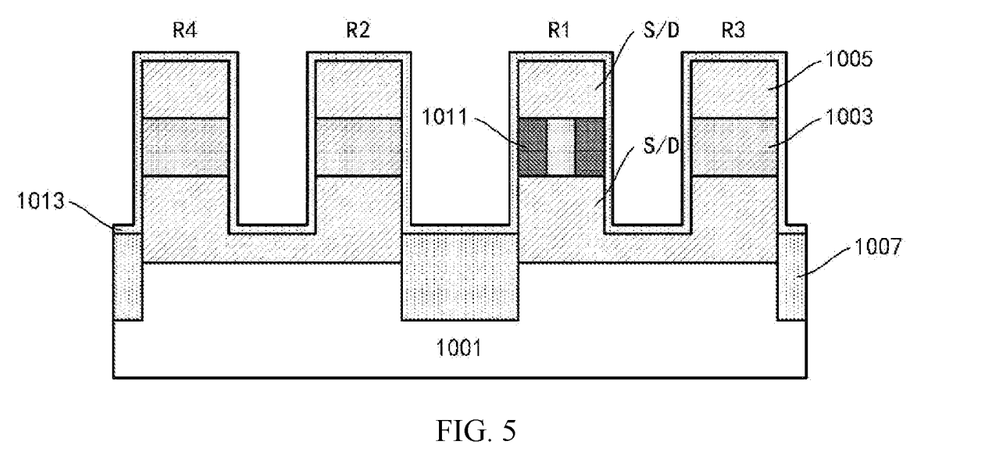

Specifically, as shown in FIG. 5, a dopant source layer 1013 may be formed on a surface of the columnar structure R1. For example, the dopant source layer 1013 may include an oxide such as a silicon oxide, in which a dopant is contained. For an n-type device, an n-type dopant may be contained; for a p-type device, a p-type dopant may be contained. The dopant source layer 1013 may be a thin film so as to be substantially conformal deposited on a surface of the structure shown in FIG. 4 by, for example, Chemical Vapor Deposition (CVD) or Atomic Layer Deposition (ALD). Next, the dopant contained in the dopant source layer 1013 may be driven into the columnar structure by, for example, annealing, thereby forming a doped region in the columnar structure, as indicated by a diagonally shaded portion in the figure. More specifically, for the columnar structure R1, source/drain regions S/D may be formed in the substrate 1001 and the semiconductor layer 1005, respectively. After that, the dopant source layer 1013 may be removed.

In addition, for the columnar structure R1, although the sacrificial gate 1011 exists, the dopant may also enter the channel layer 1003 via the substrate 1001 and the semiconductor layer 1005, so that a certain doping distribution may be formed at upper and lower ends of the channel layer 1003. The doping distribution may reduce a resistance between the source region and the drain region when the device is turned on, thereby improving a device performance.

In this example, the dopant source layer 1013 may also be formed on surfaces of the columnar structures R2 to R4. Thus, the dopant in the dopant source layer 1013 may also enter the columnar structures R2 to R4, which may help increase a conductivity of the columnar structures R2 to R4, especially when the columnar structures R2 to R4 are not subsequently fully silicified.

In addition, the dopant source layer 1013 may also be formed on a surface of the substrate 1001. Thus, the dopant in the dopant source layer 1013 may also enter a portion of the substrate 1001 close to the surface, which may help enhance electrical connections between the columnar structures R1 and R3 and between the columnar structures R2 and R4.

In the above-mentioned example, the source region and the drain region are formed by driving the dopant from the dopant source layer into the active region. However, the present disclosure is not limited thereto. For example, the source region and the drain region may be formed by ion implantation, plasma doping (e.g., conformal doping along a surface of the structure shown in FIG. 4). Alternatively, in the process described above in combination with FIG. 1, a well region may be formed in substrate 1001, and then the channel layer 1003 may be grown thereon. Next, the semiconductor layer 1005 may be grown on the channel layer 1003 and doped in situ. When growing the channel layer 1003, the channel layer 1003 may also be doped in situ in order to adjust a threshold voltage ($V_t$) of the device.

In addition, a silicification treatment may be performed on the columnar structures to reduce a contact resistance. For example, a layer of metal material, such as NiPt (with a Pt content in a range of about 1% to 10%), Co or Ti, may be deposited on the structure shown in FIG. 5 (in which the dopant source layer 1013 is removed), and then annealed at a temperature in a range of about 200° C. to 900° C., so that the metal material reacts with semiconductor materials (that is, Si and SiGe) in the columnar structures to form a silicide (i.e., a compound formed by a metal element in the metal material and a semiconductor element in the columnar structures) layer. After that, the unreacted remaining metal material may be removed.

Figure 6A:
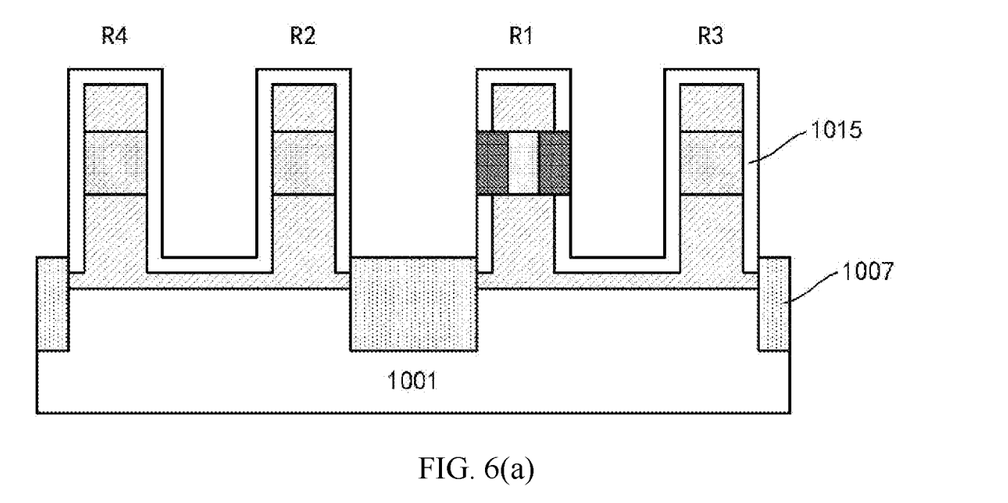
Figure 6B:
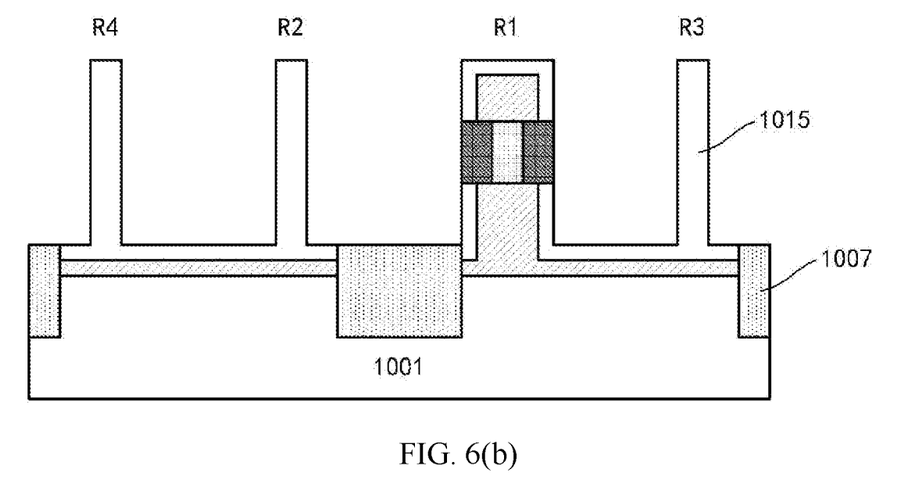

FIG. 6(a) shows a case that a silicide layer 1015 is formed on surfaces of columnar structures. According to a size of the columnar structures and an extent to which a silicification reaction proceeds, some columnar structures (e.g., columnar structures R2 to R4 for defining the capacitor electrode and the contact plug) may be fully silicified, as shown in FIG. 6(b). In the following, for the sake of brevity, the case shown in FIG. 6(a) will be mainly described as an example.

Next, a replacement gate process may be performed to replace the sacrificial gate with a real gate stack.

Figure 7:
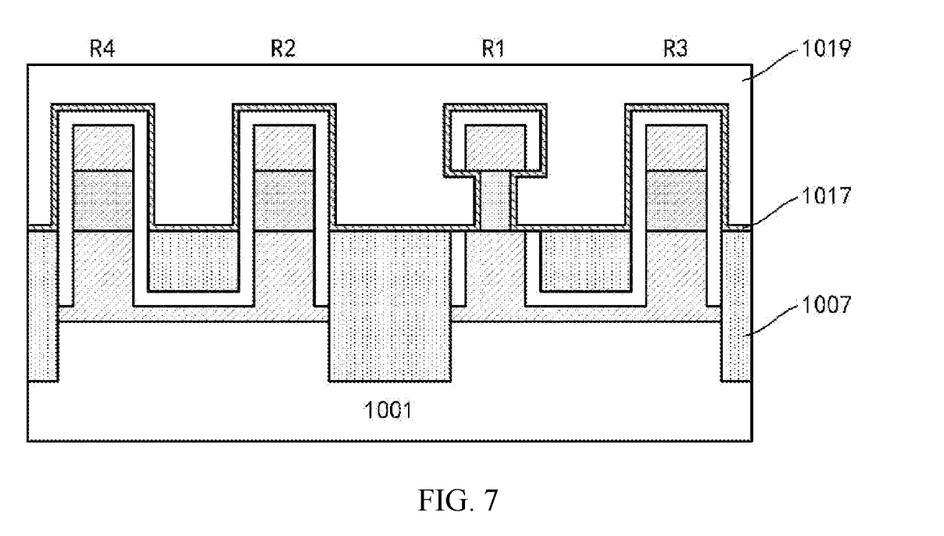

In order to reduce an overlap between the formed gate stack and the source/drain region formed in the substrate 1001, an isolation layer may be formed on the substrate. For example, as shown in FIG. 7, an oxide may be deposited on the structure shown in FIG. 6(a) and etched back so as to form an isolation layer (which is the same oxide as the isolation portion previously formed and is indicated with the isolation portion as 1007). Before being etched back, the deposited oxide may be subjected to a planarization treatment such as Chemical Mechanical Polishing (CMP) or sputtering. A top surface of the isolation layer 1007 may be close to an interface between the channel layer 1003 and the substrate 1001, for example, slightly higher than the interface between the channel layer 1003 and the substrate 1001.

Then, the sacrificial gate 1011 may be removed to release a space in the above-mentioned recess. For example, the sacrificial gate 1011 (nitride) may be selectively etched relative to the isolation layer 1007 (oxide), the silicide layer 1015, as well as the semiconductor layer 1005 (Si) and the channel layer 1003 (SiGe). A gate stack may be formed in the recess thus released. Specifically, a gate dielectric layer 1017 and a gate conductor layer 1019 may be sequentially deposited on the isolation layer 1007. For example, the gate dielectric layer 1017 may include a high-K gate dielectric such as $HfO_2$; the gate conductor layer 1019 may include a metal gate conductor. In addition, a work function adjustment layer may also be formed between the gate dielectric layer 1017 and the gate conductor layer 1019. Before the gate dielectric layer 1017 is formed, an interface layer such as an oxide may also be formed. The gate conductor layer 1019 may be subjected to a planarization treatment such as CMP.

In a region where the columnar structure R1 is located, the gate dielectric layer 1017 and the gate conductor layer 1019 may together define a gate stack surrounding the channel layer 1003. In a region where the columnar structure R2 is located, the gate dielectric layer 1017 may define a dielectric of a capacitor, and the gate conductor layer 1019 may define another capacitor electrode.

In order to optimize a performance of the capacitor, the dielectric of the capacitor may be different from the gate dielectric layer 1017. Alternatively or additionally, the another capacitor electrode may also be different from the gate conductor layer 1019. For example, a capacitor dielectric layer may be formed by deposition. And then, the capacitor dielectric layer may be removed from the region where the columnar structure R1 is located. The gate dielectric layer may be formed by deposition, and then the gate dielectric layer may be removed from the region where the columnar structure R2 is located. Similarly, different conductor layers may also be formed in different regions.

The gate conductor layer 1019 extends continuously on the substrate 1001. The gate conductor layer 1019 may be patterned to remain at a desired location (e.g., at regions where the columnar structures R1, R3 are located, so as to form a gate stack and another capacitor electrode, respectively) and may be removed from the remaining region so as to reduce a parasitic capacitance.

Figure 8:
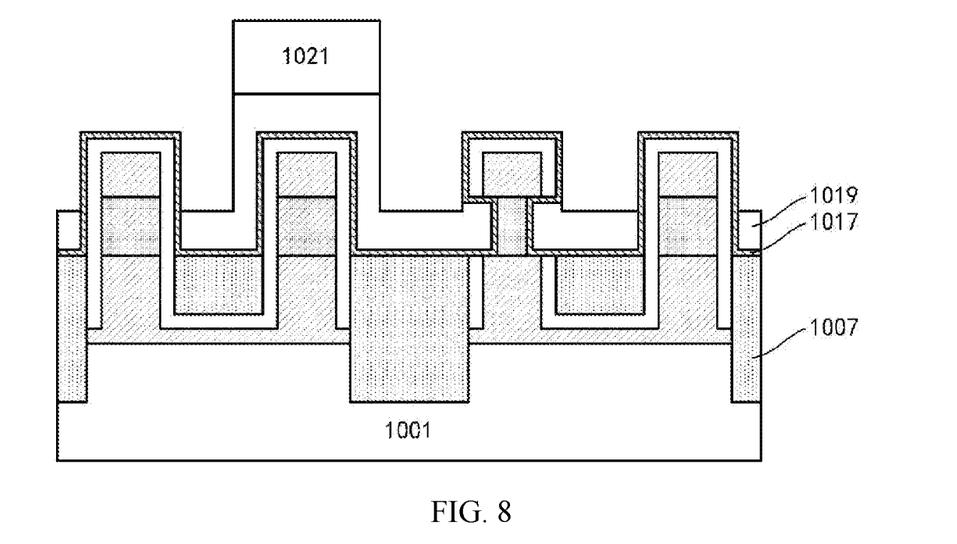

For example, as shown in FIG. 8, a photoresist 1021 may be formed and patterned to cover the gate conductor layer 1019 on a top portion of the columnar structure R2. Then, the gate conductor layer 1019 may be selectively etched, such as RIE, with the photoresist 1021 as a mask. The RIE may be performed in a vertical direction substantially perpendicular to the substrate surface. The etching may be performed so that a top surface of a portion of the gate conductor layer 1019 outside the above-mentioned recess is not higher than and preferably lower than a top surface of the channel layer 1003 (which may reduce an overlap between the gate conductor layer and the source/drain region formed in the semiconductor layer 1005). After that, the photoresist 1021 may be removed.

Figure 9:
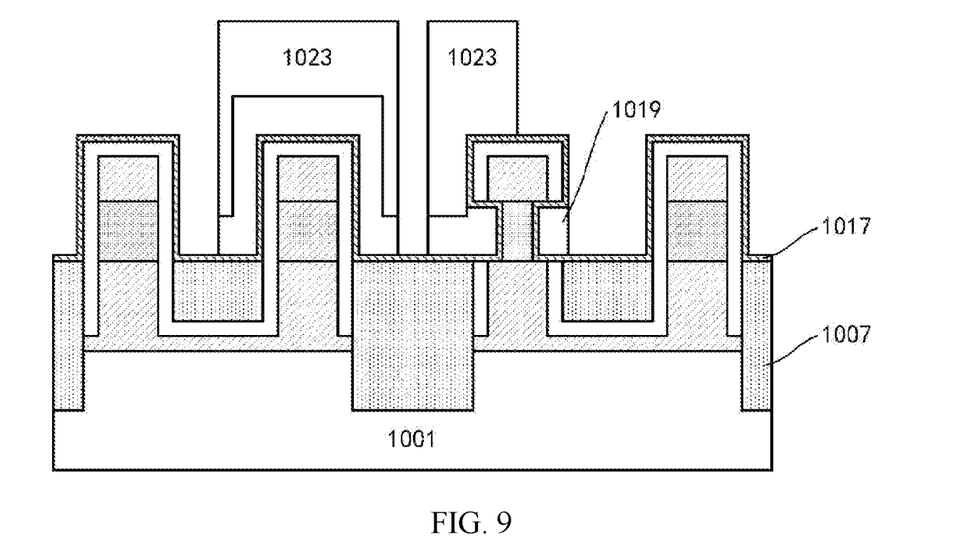

Then, as shown in FIG. 9, a photoresist 1023 may be formed and patterned to cover part of the gate conductor layer 1019 (for forming another capacitor electrode) in the region where the columnar structure R2 is located and part of the gate conductor layer 1019 (for forming a landing pad of the contact plug) around the columnar structure R1. Then, the gate conductor layer 1019 may be selectively etched, such as RIE, with the photoresist 1023 as a mask. The RIE may be performed in a vertical direction substantially perpendicular to the substrate surface. The etching may proceed until the gate dielectric layer 1017 is exposed. After that, the photoresist 1023 may be removed.

As shown in FIG. 9, in the region where the columnar structure R1 is located, the gate conductor layer 1019 and the gate dielectric layer 1017 form a gate stack, and an end of the gate stack facing the channel layer 1003 may be embedded in the above-mentioned recess so as to overlap an entire height of the channel layer 1003. In addition, in the region where the columnar structure R2 is located, the gate conductor layer 1019 extends along surfaces (specifically, top and side surfaces) of the columnar structure R2, and forms a capacitor together with the columnar structure R2 and the gate dielectric layer 1017 therebetween.

In addition, the columnar structures R3 and R4 may have higher conductivity (e.g., due to silicide and/or dopants therein) and are connected at the bottom to a lower source/drain region of the semiconductor device and a capacitor electrode, respectively, so that contact plugs to the lower source/drain region and the capacitor electrode may be formed.

In this example, top surfaces of the columnar structures R1 to R4 are substantially at the same height relative to the substrate. However, the present disclosure is not limited thereto. For example, the top surfaces of at least some of the columnar structures may be at different heights due to an intentional or unintentional etching in a process. In addition, in this example, the dummy active regions (R2 to R4) include substantially the same layer structure as the active region (R1). However, the present disclosure is not limited thereto. For example, the dummy active regions may miss part of the layer relative to the active region due to an intentional or unintentional etching in a process.

So far, the manufacturing of the device has been basically completed. Next, various interconnect structures may be fabricated.

Figure 10:
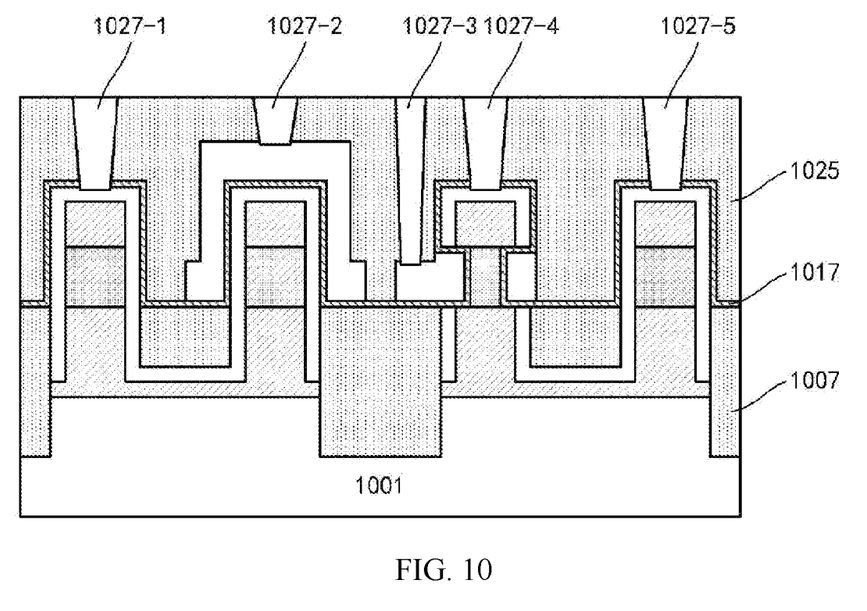

For example, as shown in FIG. 10, an interlayer dielectric layer 1025 may be formed on the substrate 1001. For example, an oxide may be deposited and planarized, such as CMP, to form the interlayer dielectric layer 1025. A contact portion 1027-1 to the columnar structure R4 (and thus to the capacitor electrode formed by the columnar structure R2), a contact portion 1027-2 to another capacitor electrode formed by the gate conductor layer 1019, a contact portion 1027-3 to the gate conductor layer 1019, a contact portion 1027-4 to an upper source/drain region, and a contact portion 1027-5 to the columnar structure R3 (and thus to a lower source/drain region) may be formed in the interlayer dielectric layer 1025. The contact portions may be formed by etching a void and filling the void with a conductive material such as a metal.

A metallization stack may be further formed on the interlayer dielectric layer 1025. For example, the capacitor may be used as a decoupling capacitor and may be connected to source/drain region (e.g., 1027-4 or 1027-5) of the device through, for example, the contact portion 1027-2, so as to stabilize a voltage on the source/drain region. The larger the capacitor, the more stable the voltage. Voltages applied to two plates of the capacitor may be different.

In the above-mentioned embodiments, in order to reduce an overlap between the gate stack and the lower source/drain region, a bottom surface of the gate conductor layer is in the vicinity of a bottom surface of the channel layer, and a bottom surface of a portion of the gate conductor layer serving as another capacitor electrode is substantially at the same height. However, a height of the columnar structure R2 is not fully utilized. The another capacitor electrode may extend on more surfaces of the columnar structure R2 so as to increase a capacitance.

Figure 11A:
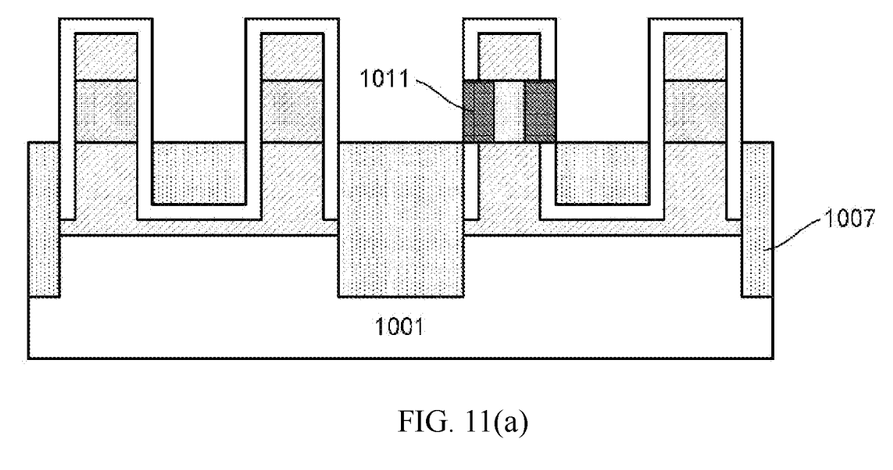
Figure 11B:
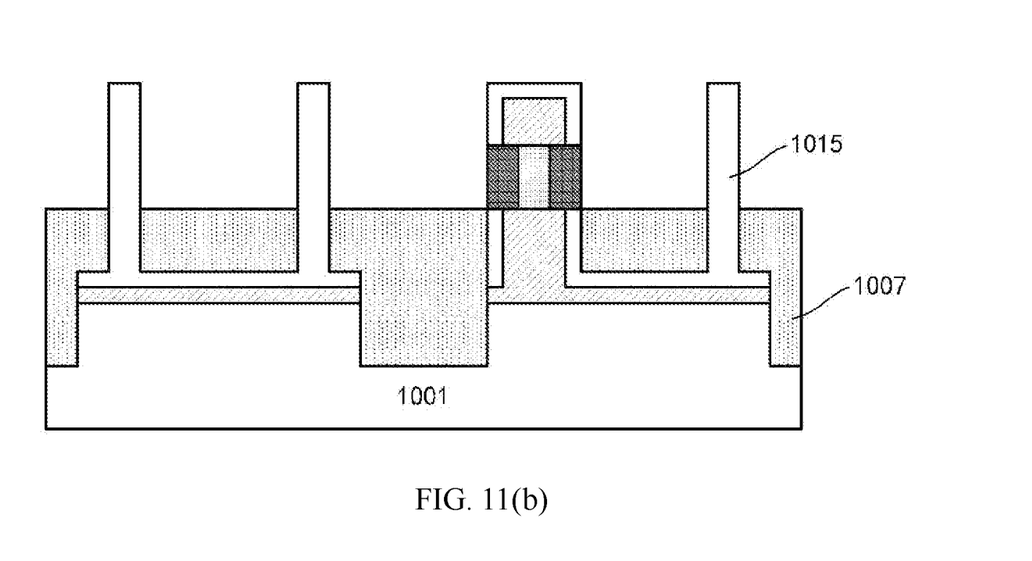

For example, the isolation layer 1007 may be formed as described above in combination with FIG. 7. FIG. 11(*a*) and FIG. 11(*b*) show cases after the isolation layer 1007 is formed. FIG. 11(*a*) and FIG. 11(*b*) correspond to cases that the columnar structures R2 to R4 are not fully silicified and are fully silicified, respectively.

Figure 12:
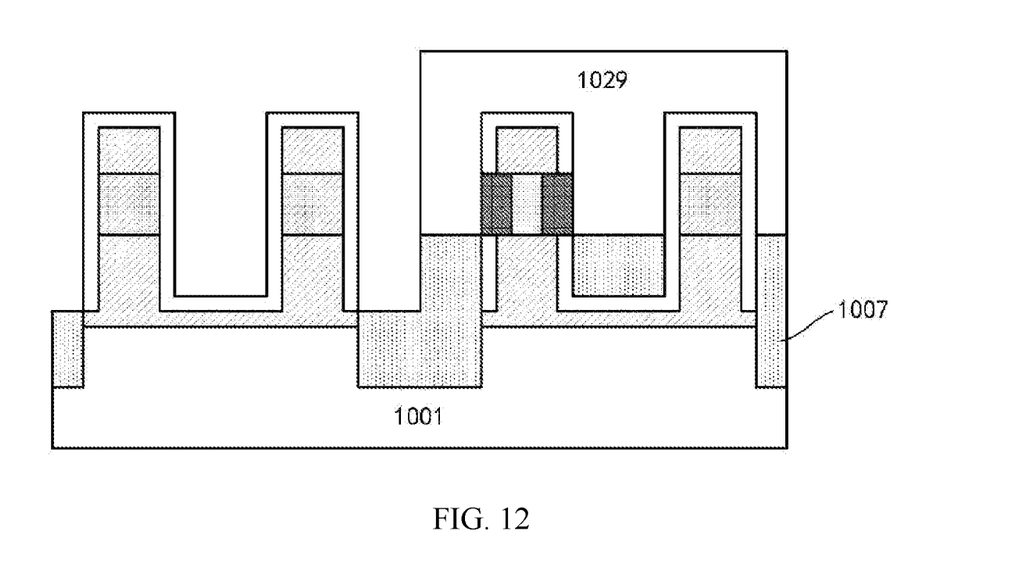

As mentioned above, the top surface of the isolation layer 1007 is arranged near the bottom surface of the channel layer 1003 in order to mainly reduce an overlap between the gate conductor layer formed subsequently and the lower source/drain region. For a region where the capacitor is located, such design is not required. Therefore, the top surface of the isolation layer 1007 in the region where the capacitor is located may be lowered. For example, as shown in FIG. 12, a photoresist 1029 may be formed and patterned to cover a region where the semiconductor device is located and to expose the region where the capacitor is located. Then, the isolation layer may be selectively etched, such as RIE, with the photoresist 1029 as a mask, so that more surfaces of the columnar structure R2 may be exposed.

Figure 13:
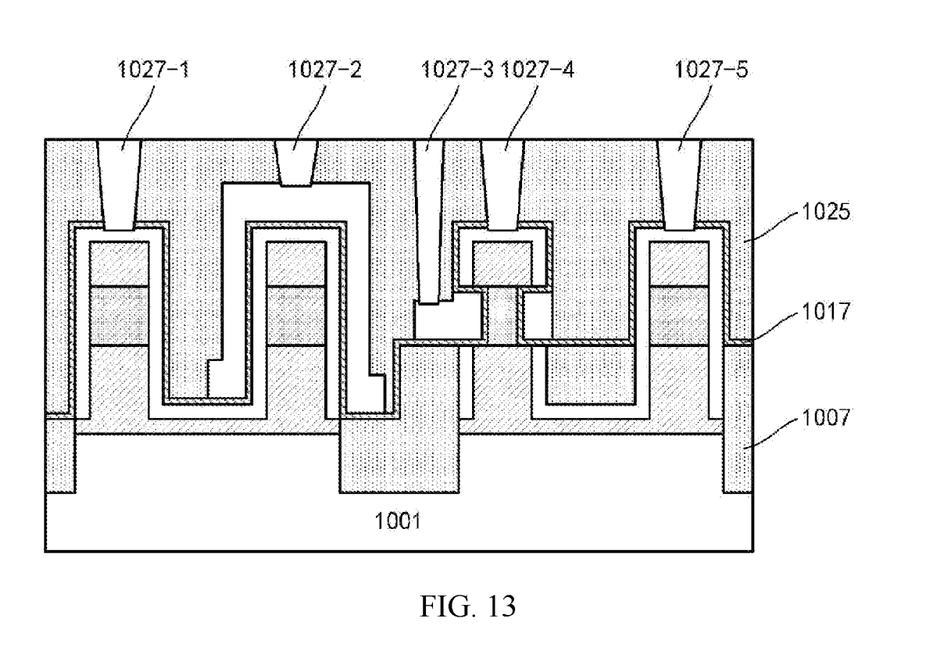

Then, the semiconductor apparatus as shown in FIG. 13 may be formed by further forming a gate stack, another capacitor electrode and various contact portions according to the above-mentioned processes. As shown in FIG. 13, the another capacitor electrode may extend further downward relative to the gate conductor layer of the semiconductor device, so as to extend on more surfaces of the columnar structure R2 (in this example, extend over almost an entire height of the columnar structure R2), so that a larger capacitance may be acquired.

According to embodiments of the present disclosure, the capacitor electrodes may be defined together with the active region of the semiconductor device, so that a capacitor with a small occupied area may be manufactured relatively easily.

The semiconductor apparatus according to embodiments of the present disclosure may be applied to various electronic devices. For example, an integrated circuit (IC) may be formed based on the semiconductor apparatus, and an electronic device may be constructed therefrom. Therefore, the present disclosure further provides an electronic device including the above-mentioned semiconductor apparatus. The electronic device further include components such as a display screen cooperating with the integrated circuit and a wireless transceiver cooperating with the integrated circuit. Such an electronic device may include, for example, a smart phone, a computer, a tablet computer (PC), a wearable smart device, a mobile power supply, and so on.

According to embodiments of the present disclosure, there is further provided a method of manufacturing a system on a chip (SoC), which may include the above-mentioned methods. Specifically, a variety of devices may be integrated on the chip, at least some of which are manufactured according to the methods of the present disclosure.

In the above-mentioned description, the technical details such as patterning and etching of each layer have not been described in detail. However, those skilled in the art should understand that various technical means may be used to form layers, regions, etc. of desired shapes. In addition, in order to form the same structure, those skilled in the art may further design a method that is not exactly the same as the method described above. In addition, although the various embodiments have been described above separately, this does not mean that the measures in the various embodiments may not be advantageously used in combination.

Embodiments of the present disclosure have been described above. However, the examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A semiconductor apparatus, comprising:
    a vertical semiconductor device comprising an active region extending vertically on a substrate; and
    a capacitor comprising a first capacitor electrode, a capacitor dielectric layer, and a second capacitor electrode sequentially stacked,
    wherein the first capacitor electrode extends vertically on the substrate and comprises a conductive material, and the conductive material contains at least one semiconductor element contained in the active region of the vertical semiconductor device.

2. The semiconductor apparatus according to claim 1, wherein in a vertical direction, the at least one semiconductor element contained in the first capacitor electrode has a change in an element type and/or element content.

3. The semiconductor apparatus according to claim 2, wherein the change is a sudden change at a certain height relative to the substrate.

4. The semiconductor apparatus according to claim 2, wherein in the vertical direction, the at least one semiconductor element contained in at least a portion of the vertical semiconductor device has a change in the element type and/or element content substantially the same as the change in the element type and/or element content of the at least one semiconductor element contained in the first capacitor electrode.

5. The semiconductor apparatus according to claim 1, wherein in a vertical direction, a distribution for a semiconductor element contained in the first capacitor electrode is substantially the same as a distribution for a semiconductor element contained in the active region of the vertical semiconductor device.

6. The semiconductor apparatus according to claim 1, wherein a top surface of the first capacitor electrode and a top surface of the active region of the vertical semiconductor device are at substantially the same height relative to the substrate.

7. The semiconductor apparatus according to claim 1, wherein the first capacitor electrode comprises a lower portion, a middle portion and an upper portion sequentially arranged in a vertical direction, and
    the active region of the vertical semiconductor device comprises a first source/drain layer, a channel layer and a second source/drain layer sequentially stacked in the vertical direction, and
    wherein the lower portion of the first capacitor electrode contains a semiconductor element of the first source/drain layer, the middle portion of the first capacitor electrode contains a semiconductor element of the channel layer, and the upper portion of the first capacitor electrode contains a semiconductor element of the second source/drain layer.

8. The semiconductor apparatus according to claim 7, wherein
    the lower portion of the first capacitor electrode is substantially coplanar with the first source/drain layer; and/or
    the middle portion of the first capacitor electrode is substantially coplanar with the channel layer; and/or
    the upper portion of the first capacitor electrode is substantially coplanar with the second source/drain layer.

9. The semiconductor apparatus according to claim 1, wherein the conductive material is a conductive compound of the at least one semiconductor element and a metal element.

10. The semiconductor apparatus according to claim 9, wherein a portion of the first capacitor electrode close to a surface of the first capacitor electrode is the conductive compound: or
    the whole first capacitor electrode is the conductive compound.

11. The semiconductor apparatus according to claim 9, wherein the first capacitor electrode has a doping impurity.

12. The semiconductor apparatus according to claim 11, wherein the doping impurity is the same as a doping impurity in a source/drain region of the vertical semiconductor device.

13. The semiconductor apparatus according to claim 1, wherein in a plan view, the first capacitor electrode and the active region of the vertical semiconductor device have substantially the same shape.

14. The semiconductor apparatus according to claim 1, wherein the vertical semiconductor device comprises a gate stack, and the gate stack comprises a gate dielectric layer and a gate conductor layer sequentially arranged, and
    wherein the capacitor dielectric layer comprises a same dielectric material as the gate dielectric layer, and/or
    the second capacitor electrode comprises a same conductive material as the gate conductor layer.

15. The semiconductor apparatus according to claim 14, wherein a bottom surface of the second capacitor electrode and a bottom surface of the gate conductor layer are at substantially the same height relative to the substrate; or
    a bottom surface of the second capacitor electrode is closer to the substrate than a bottom surface of the gate conductor layer.

16. The semiconductor apparatus according to claim 1, further comprising:
    a contact plug to the first capacitor electrode, wherein the contact plug extends vertically on the substrate and comprises a conductive material, and the conductive material contains at least one semiconductor element contained in the active region of the vertical semiconductor device.

17. The semiconductor apparatus according to claim 16, wherein in a vertical direction, a distribution for a semiconductor element contained in the contact plug is substantially the same as a distribution for a semiconductor element contained in the first capacitor electrode.

18. The semiconductor apparatus according to claim 16, wherein a top surface of the contact plug and a top surface of the first capacitor electrode are at substantially the same height relative to the substrate.

19. The semiconductor apparatus according to claim 16, wherein the first capacitor electrode comprises a lower portion, a middle portion and an upper portion sequentially arranged in a vertical direction, and
the contact plug comprises a lower portion, a middle portion and an upper portion sequentially arranged in the vertical direction, and
wherein the lower portion of the contact plug and the lower portion of the first capacitor electrode contain a same semiconductor element, and the middle portion of the contact plug and the middle portion of the first capacitor electrode contain a same semiconductor element, and the upper portion of the contact plug and the upper portion of the first capacitor electrode contain a same semiconductor element.

20. The semiconductor apparatus according to claim 19, wherein
the lower portion of the contact plug is substantially coplanar with the lower portion of the first capacitor electrode; and/or
the middle portion of the contact plug is substantially coplanar with the middle portion of the first capacitor electrode; and/or
the upper portion of the contact plug is substantially coplanar with the upper portion of the first capacitor electrode.

21. The semiconductor apparatus according to claim 1, wherein the second capacitor electrode is electrically connected to a source/drain region of the vertical semiconductor device.

22. The semiconductor apparatus according to claim 16, wherein a lower portion of the contact plug extends continuously with a lower portion of the first capacitor electrode.

23. The semiconductor apparatus according to claim 1, wherein the active region of the vertical semiconductor device comprises a first source/drain layer, a channel layer, and a second source/drain layer sequentially stacked in a vertical direction, and
wherein the channel layer comprises a single crystal semiconductor material.

24. The semiconductor apparatus according to claim 23, wherein the first source/drain layer and the second source/drain layer comprise a single crystal semiconductor material.

25. The semiconductor apparatus according to claim 23, wherein the vertical semiconductor device comprises a gate stack, and at least an end of the gate stack facing the active region being substantially coplanar with the channel layer.

26. An electronic device comprising the semiconductor apparatus according to claim 1.

27. A method of manufacturing a semiconductor apparatus, comprising:
forming a stack of a first semiconductor layer, a second semiconductor layer, and a third semiconductor layer on a substrate;
patterning the stack into a first vertical structure and a second vertical structure;
laterally recessing the second semiconductor layer in the first vertical structure relative to the first semiconductor layer and the third semiconductor layer in the first vertical structure, and forming a sacrificial gate in a formed recess;
driving a doping impurity inward from a surface of the first vertical structure and a surface of the second vertical structure;
forming an isolation layer on the substrate;
removing the sacrificial gate;
forming a gate stack, on the isolation layer, around at least a portion of a periphery of the second semiconductor layer in the first vertical structure; and
forming a capacitor dielectric layer and another capacitor electrode on the surface of the second vertical structure.

28. The method according to claim 27, wherein the stack is formed by an epitaxial growth.

29. The method according to claim 27, wherein the first semiconductor layer, the second semiconductor layer, and the third semiconductor layer comprise a single crystal semiconductor material.

30. The method according to claim 27, further comprising:
performing a silicification treatment on the first vertical structure and the second vertical structure.

31. The method according to claim 30, wherein the second vertical structure is fully converted to a suicide.

32. The method according to claim 27, further comprising:
patterning the stack into the first vertical structure, the second vertical structure, and a third vertical structure,
wherein driving the doping impurity further comprises driving the doping impurity into the third vertical structure and into a portion of the substrate or the first semiconductor layer between the second vertical structure and the third vertical structure.

33. The method according to claim 30, further comprising:
patterning the stack into the first vertical structure, the second vertical structure, and a third vertical structure,
wherein the silicification treatment further comprises performing the silicification treatment on the third vertical structure and on a portion of the substrate or the first semiconductor layer between the second vertical structure and the third vertical structure.

34. The method according to claim 27, wherein forming the isolation layer further comprises:
at least partially etching back a portion of the isolation layer around the second vertical structure so as to expose more portions of the second vertical structure.

35. The method according to claim 26, wherein
forming the gate stack comprises:
sequentially forming a gate dielectric layer and a gate conductor layer on the isolation layer; and
patterning the gate conductor layer so that a portion surrounds the second semiconductor layer in the first vertical structure, so as to form the gate stack for the first vertical structure together with the gate dielectric layer; and
forming the capacitor dielectric layer and the another capacitor electrode comprises:

patterning the gate conductor layer so that another portion extends along the surface of the second vertical structure, so as to form a capacitor together with the gate dielectric layer and the second vertical structure.

* * * * *